(12) United States Patent
Wang et al.

(10) Patent No.: US 8,105,438 B2
(45) Date of Patent: Jan. 31, 2012

(54) FILM COATING COVER AND FILM COATING DEVICE USING SAME

(75) Inventors: Chung-Pei Wang, Taipei Hsien (TW); Ching-Chou Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 601 days.

(21) Appl. No.: 12/275,342

(22) Filed: Nov. 21, 2008

(65) Prior Publication Data
US 2009/0229514 A1 Sep. 17, 2009

(30) Foreign Application Priority Data
Mar. 17, 2008 (CN) .......................... 2008 1 0300610

(51) Int. Cl.
*B05C 21/00* (2006.01)
(52) U.S. Cl. ....................................... 118/728; 118/500

(58) Field of Classification Search .................. 118/500, 118/728; 206/5.1; 220/485; 219/634; 204/298.15
See application file for complete search history.

(56) References Cited

U.S. PATENT DOCUMENTS

| | | | | | |
|---|---|---|---|---|---|
| 2,263,008 | A | * | 11/1941 | McRae | 118/728 |
| 5,325,812 | A | * | 7/1994 | Thiebaud et al. | 118/500 |
| 2006/0196423 | A1 | * | 9/2006 | Huang | 118/720 |

* cited by examiner

*Primary Examiner* — Laura Edwards
(74) *Attorney, Agent, or Firm* — Altis Law Group, Inc.

(57) ABSTRACT

An exemplary film coating device includes a film coating holder and a film coating cover. The film coating holder includes a plurality of through holes defined therein for receiving workpieces to be coated. The film coating cover includes a first cover body and a second cover body. The first cover body includes a frame and a plurality of arms. A plurality of shelter pieces is set on the inner side of each arm. Each shelter piece is spatially arranged corresponding to one of the plurality of through holes. The second cover body is configured for covering the first cover body. The height of the second cover body is no less than that of the first cover body.

12 Claims, 2 Drawing Sheets

FILM COATING COVER AND FILM COATING DEVICE USING SAME

BACKGROUND

1. Technical Field

The present invention relates to a film coating cover and a film coating device using the filming coating cover.

2. Discussion of Related Art

Generally, in a film coating process for workpieces (e.g., lenses), the workpieces are placed on a film coating holder. In a single-side film coating process, when a surface of each workpiece is being coated, an opposite surface of each workpiece may be contaminated by the coating material. Moreover, because of the high temperature of film coating process, the workpieces may subject to deformation.

Therefore, a new film coating device and a film coating cover of the film coating device are desired to overcome the shortcomings described above.

SUMMARY

An exemplary film coating device includes a film coating holder and a film coating cover. The film coating holder includes a plurality of through holes defined therein for receiving workpieces to be coated. The film coating cover includes a first cover body and a second cover body. The first cover body includes a frame and a plurality of arms. A plurality of shelter pieces is set on the inner side of each arm. Each shelter piece is spatially arranged corresponding to one of the plurality of through holes. The second cover body is configured for covering the first cover body. The height of the second cover body is no less than that of the first cover body.

BRIEF DESCRIPTION OF THE DRAWINGS

Many aspects of the present portable electronic device can be better understood with reference to the accompanying drawings. The components in the drawings are not necessarily drawn to scale, the emphasis instead being placed upon clearly illustrating the principles of the present portable electronic device. Moreover, in the drawings, like reference numerals designate corresponding parts throughout the several views.

DETAILED DESCRIPTION OF EMBODIMENTS

Reference will now be made to the drawings to describe in detail of the exemplary embodiment of the film coating device.

Figure 1:
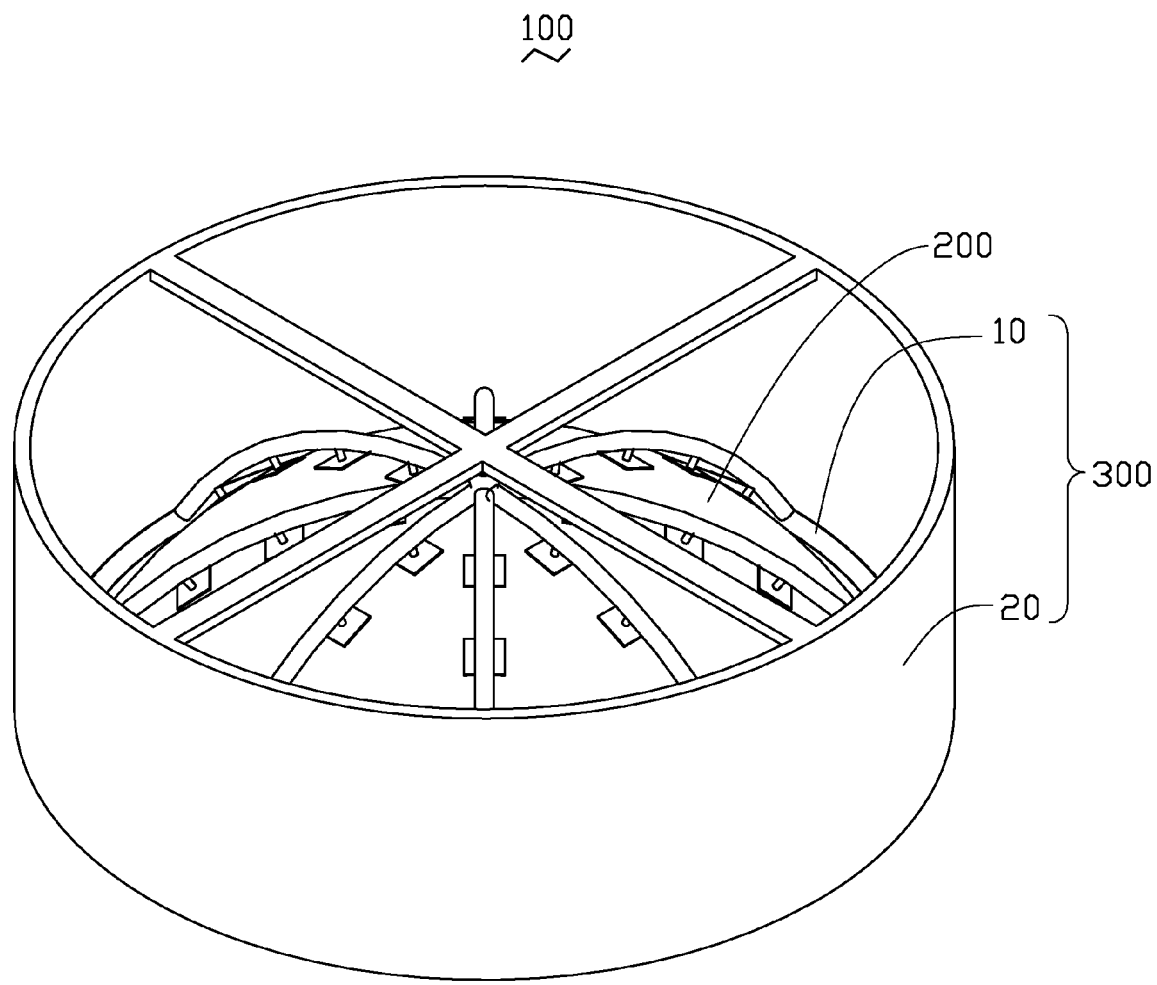
FIG. 1 is a schematic, isometric view of a film coating device in accordance with an exemplary embodiment.
Figure 2:
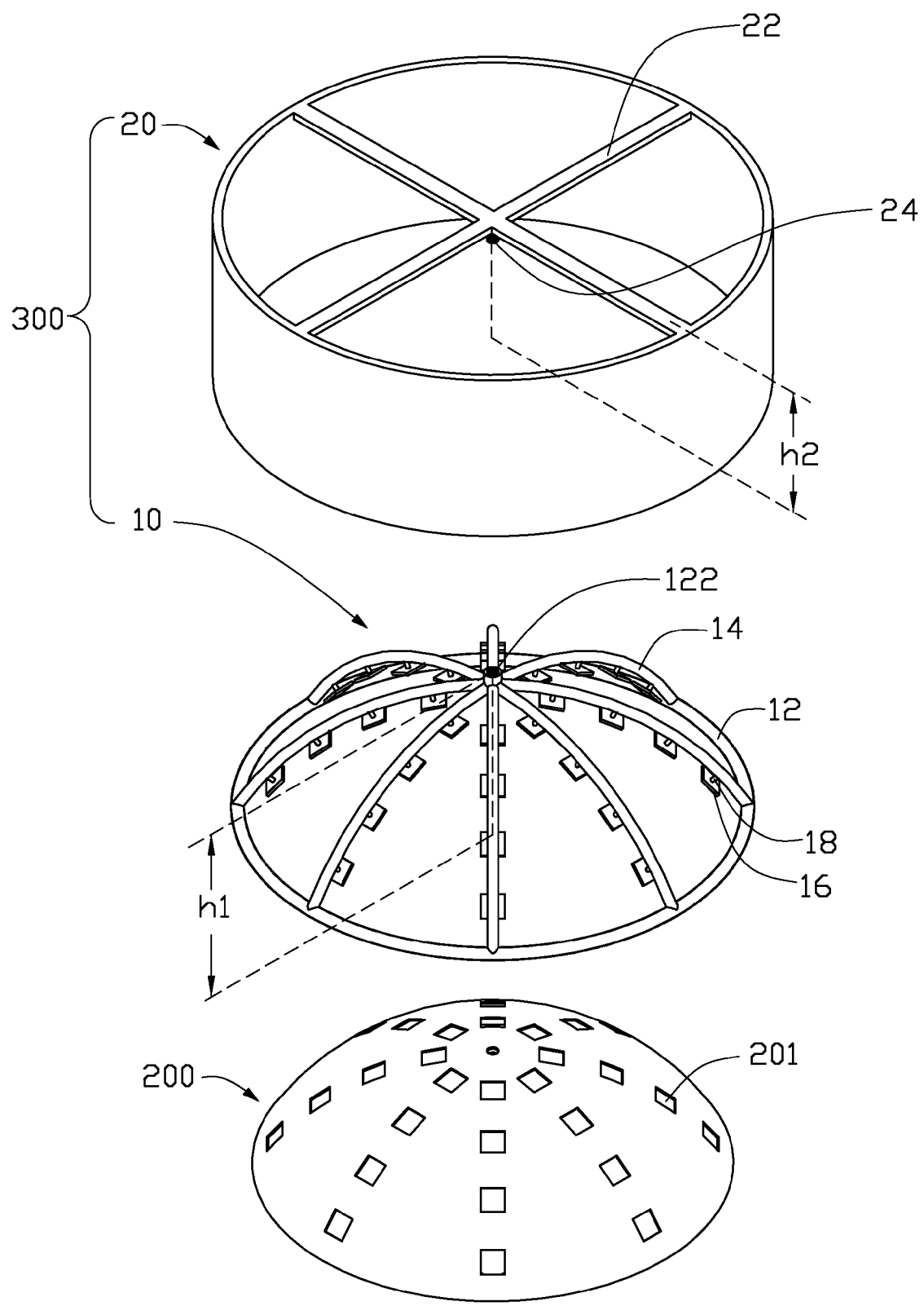
FIG. 2 is a schematic, exploded view of the film coating device of FIG. 1.

Referring to FIGS. 1 and 2, a film coating device 100, in accordance with an exemplary embodiment, includes a film coating holder 200 and film coating cover 300. The film coating cover 300 is configured for covering the film coating holder 200.

The film coating holder 200 includes a plurality of through holes 201 defined therein for receiving the workpieces (not shown) to be coated. Each through hole 201 has the same size with each other and is arranged in a predetermined order. The film coating holder 200 is umbrella-shaped. In coating process, the coating material is placed under the film coating holder 200. The film coating holder 200 is made of a highly thermally conductive metallic material, such as copper, aluminum, or stainless steel.

The film coating cover 300 includes a first cover body 10 and a second cover body 20. The first cover body 10 covers the film coating holder 200. The second cover body 20 is configured for covering the first cover body 10.

Referring to FIG. 2, the first cover body 10 is umbrella-shaped and includes a circular frame 12 and eight arc-shaped arms 14. One end of each arc-shaped arm 14 is connected to the circular frame 12, and the other end of each arc-shaped arm 14 is connected to each other. Each arc-shaped arm 14 is equidistant to each other. A plurality of shelter pieces 16 is arranged on the inner side of each arc-shaped arm 14. Each shelter piece 16 is rotatably mounted on the arc-shaped arm 14 through a connecting shaft 18. Each connecting shaft 18 is rotatably connected to the arc-shaped arm 14, thus, each shelter piece 16 can rotate to a certain angle. In the present embodiment, each shelter piece 16 has the same size with each other and is symmetrically arranged on the first cover body 10. The shape of each shelter piece 16 is set as the same shape with the through holes 201 of the film coating holder 200, and the arrangement of shelter pieces 16 is corresponding to that of the through holes 201 of the film coating holder 200.

In coating, the coating material vaporizes and the vapor of the coating material rises upward from the underside of the film coating holder 200. The surface of each workpiece, which is facing the coating material, will be coated by the vapors of the material, and an opposite surface of each workpiece will remain clean without contaminating. The first cover body 10 can cover the upward surface of each workpiece that is not required to be coated, so the first cover body 10 can prevent the upper surface of each workpiece from being contaminated. On the other hand, each shelter piece 16 presses the corresponding workpiece to prevent it from warping and deforming.

The second cover body 20 is configured for covering the first cover body 10. If the height of the first cover body 10 is h1 and the height of second cover body 20 is h2, the height h2 of the second cover body 20 should be no less than the height h1 of the first cover body 10. Accordingly, the second cover body 20 can receive the first cover body 10 therein. The second cover body 20 is columnar or umbrella-shaped. In the present embodiment, the second cover body 20 is columnar and hollow, and has a cross-shaped beam 22 on the top. A bolt 24 facing the holder 10 is arranged on the center of the beam 22. Accordingly, a screw hole 122 is defined in the top center of the first cover body 10. The first cover body 10 can be fixed to the second cover body 20 by engaging the bolt 24 into the screw hole 122. It is to be understood that the first and the second cover bodies 10, 20 can be fixed by other means, such as, use hinge or rope to make them fixed.

The first cover body 10, the second cover body 20 and the film coating holder 200 are all circular, and the diameters of the bottom surface of these three parts match with each other. In the present embodiment, the diameter of the bottom surface of first cover body 10 is slightly larger than that of the film coating holder 200, and slightly less than that of the second cover body 20. Therefore, the film coating holder 200 can be covered by the first cover body 10, and the first cover body 10 and the film coating holder 200 can be entirely covered by the second cover body 20. So, the vapors of the material will not contact directly to the periphery of the film coating holder 200 and the first cover body 10. By using the first and second cover bodies 10, 20, the film coating holder 200 and the workpieces can be prevented from being contaminated by the coating material to the sidewall of each workpiece to effectively film coated the desired area without contaminating surrounding areas.

In operation, firstly, the workpieces are received in the corresponding through holes 201. Secondly, the first cover body 10 is placed onto the film coating holder 200 to cover it, and each shelter piece 16 is aligned to corresponding through hole 201. Thirdly, the second cover body 20 is covered on the first cover body 10 and the film coating holder 200. Fourthly, the first and the second cover bodies 10, 20 are fixed with each other by coupling the bolt 24 to the screw hole 122. The film coating device 100 is thus assembled and can be used to conduct the film coating process.

While the present invention has been described as having preferred or exemplary embodiments, the embodiments can be further modified within the spirit and scope of this disclosure. This application is therefore intended to cover any variations, uses, or adaptations of the embodiments using the general principles of the invention as claimed. Further, this application is intended to cover such departures from the present disclosure as come within known or customary practice in the art to which the invention pertains and which fall within the limits of the appended claims or equivalents thereof.

What is claimed is:

1. A film coating device, comprising:
a film coating holder, the film coating holder comprising a plurality of through holes defined therein for receiving workpieces to be coated; and
a film coating cover, the film coating cover comprising a first cover body and a second cover body, the first cover body comprising a circular frame and a plurality of arc-shaped arms, an end of each arc-shaped arm connected to the circular frame, an opposite end of each arc-shaped arm connected to each other at a common point, a plurality of shelter pieces set on an inner side of each arc-shaped arm, each shelter piece being spatially arranged corresponding to one of the plurality of through holes, the first cover body covering a surface of each workpiece not required to be coated, each shelter piece pressing a corresponding workpiece to prevent it from warping and deforming, the second cover body being configured for covering the first cover body, a height of the second cover body being no less than that of the first cover body.

2. The film coating device of claim 1, wherein a shape of each of the plurality of shelter pieces is set as the same as that of each of the plurality of through holes.

3. The film coating device of claim 1, wherein each shelter piece has the same size with each other and is symmetrically arranged on the first cover body, corresponding to the through holes that are symmetrically arranged.

4. The film coating device of claim 1, wherein each shelter piece is rotatably mounted on the inner side of the arm through a connecting shaft, and the connecting shaft is rotatably connected to the arm.

5. The film coating device of claim 1, wherein the diameters of a bottom surface of the first cover body, the second cover body, and the film coating holder match with each other.

6. A film coating cover used for covering a film coating holder, the film coating holder comprising a plurality of through holes defined therein for receiving workpieces to be coated, the film coating cover comprising a first cover body and a second cover body, the first cover body comprising a circular frame and a plurality of arc-shaped arms, an end of each arc-shaped arm connected to the circular frame, an opposite end of each arc-shaped arm connected to each other at a common point, a plurality of shelter pieces set on an inner side of each arc-shaped arm, each shelter piece being spatially arranged corresponding to one of the plurality of through holes, the first cover body covering a surface of each workpiece not required to be coated, each shelter piece pressing a corresponding workpiece to prevent it from warping and deforming, the second cover body being configured for covering the first cover body, a height of the second cover body being no less than that of the first cover body.

7. The film coating cover of claim 6, wherein a shape of each of the plurality of shelter pieces is set as the same as that of each of the plurality of through holes.

8. The film coating cover of claim 6, wherein each shelter piece has the same size with each other and is symmetrically arranged on the first cover body, corresponding to the through holes that are symmetrically arranged.

9. The film coating cover of claim 6, wherein each shelter piece is rotatably mounted on the inner side of the arm through a connecting shaft, and the connecting shaft is rotatably connected to the arm.

10. The film coating cover of claim 6, wherein the diameters of a bottom surface of the first cover body, the second cover body, and the film coating holder match with each other.

11. The film coating device of claim 1, wherein the first cover body further comprises a screw hole at a top center of the first cover body, the second cover body comprises a cross-shaped beam located on a top side thereof, and a bolt facing the holder arranged on the center of the cross-shaped beam, the bolt being engaged in the screw hole to fix the first cover body to the second cover body.

12. The film coating cover of claim 6, wherein the first cover body further comprises a screw hole at a top center of the first cover body, the second cover body comprises a cross-shaped beam located on a top side thereof, and a bolt facing the holder arranged on the center of the cross-shaped beam, the bolt being engaged in the screw hole to fix the first cover body to the second cover body.

* * * * *